(12) United States Patent
Alisar et al.

(10) Patent No.: US 12,341,516 B2
(45) Date of Patent: Jun. 24, 2025

(54) CONTROL METHOD OF A HYBRID POWER SWITCH

(71) Applicant: Siemens Gamesa Renewable Energy Innovation & Technology S.L., Sarriguren (ES)

(72) Inventors: Ibrahim Alisar, Nuremberg (DE); Erhan Demirok, Izmir (TR); José Luis Rodriguez Izal, Burlada (ES)

(73) Assignee: SIEMENS GAMESA RENEWABLE ENERGY INNOVATION & TECHNOLOGY S.L., Sarriguren (ES)

( * ) Notice: Subject to any disclaimer, the term of this patent is extended or adjusted under 35 U.S.C. 154(b) by 98 days.

(21) Appl. No.: 18/551,976

(22) PCT Filed: Mar. 14, 2022

(86) PCT No.: PCT/EP2022/056524
§ 371 (c)(1),
(2) Date: Sep. 22, 2023

(87) PCT Pub. No.: WO2022/200101
PCT Pub. Date: Sep. 29, 2022

(65) Prior Publication Data
US 2024/0171157 A1    May 23, 2024

(30) Foreign Application Priority Data
Mar. 24, 2021   (EP) ..................................... 21382238

(51) Int. Cl.
H03K 3/011   (2006.01)
H02M 1/088   (2006.01)
(Continued)

(52) U.S. Cl.
CPC ............ *H03K 3/011* (2013.01); *H02M 1/088* (2013.01); *H03K 5/01* (2013.01); *H03K 17/14* (2013.01); *H03K 2005/00013* (2013.01)

(58) Field of Classification Search
CPC .... H03K 17/14; H03K 17/127; H03K 17/122; H03K 5/01; H03K 2017/0806; H03K 2217/0036; H03K 3/011; H02M 1/088
See application file for complete search history.

(56) References Cited

U.S. PATENT DOCUMENTS 11,018,664 B2 *  5/2021  Bernardoni .......... H03K 17/122
2013/0257177 A1 * 10/2013  Jacobson ......... H03K 17/04123
                                                    307/115
(Continued)

FOREIGN PATENT DOCUMENTS

EP        3195475 B1    9/2019
EP        3539215 B1    1/2020
WO     2016014907 A1    1/2016

OTHER PUBLICATIONS

Li Zongjian et al: "Active Gate Delay Time Control of Si/SiC Hybrid Switch for Junction Temperature Balance Over a Wide Power Range", IEEE Transactions on Power Electronics, Institute of Electrical and Electronics Engineers, USA, vol. 35, No. 5, Sep. 18, 2019 (Sep. 18, 2019), pp. 5354-5365, XP011775366, ISSN: 0885-8993, DOI: 10.1109/TPEL.2019.2942044 [retrieved on Feb. 27, 2020] figures 1, 2.

(Continued)

Primary Examiner — Patrick C Chen
(74) Attorney, Agent, or Firm — Schmeiser, Olsen & Watts LLP

(57) ABSTRACT

A control method of a hybrid power switch having at least a first switching device connected in parallel with a second switching device is provided. A first gate signal is provided to the first switching device for turning on and turning off the (Continued)

first switching device. A second gate signal is provided to the second switching device for turning on and turning off the second switching device. A first delay time is stablished between the turning on of the first switching device and the turning on of the second switching device, and a second delay time is established between the turning off of the first switching device and the turning off of the second switching device. The temperature of the first switching device is determined, and at least one of the first and second delay times is modified depending on such temperature.

10 Claims, 8 Drawing Sheets

(51) Int. Cl.
  *H03K 5/00* (2006.01)
  *H03K 5/01* (2006.01)
  *H03K 17/14* (2006.01)

(56) References Cited

U.S. PATENT DOCUMENTS

| | | | |
|---|---|---|---|
| 2016/0191021 A1* | 6/2016 | Zhao | H03K 17/567 327/109 |
| 2018/0145609 A1 | 5/2018 | Louvrier et al. | |
| 2019/0386652 A1 | 12/2019 | Korner | |
| 2022/0376605 A1* | 11/2022 | Rahimo | H02M 1/088 |

OTHER PUBLICATIONS

PCT International Search Report and Written Opinion of International Searching Authority mailed Jun. 7, 2022 corresponding to PCT International Application No. PCT/EP2022/056524 filed Mar. 14, 2022.

U. R. Vemulapati, A. Mihaila, R. A. Minamisawa, F. Canales, M. Rahimo and C. Papadopoulos, "Simulation and experimental results of 3.3kV cross switch "Si-IGBT and SiC-MOSFET" hybrid," 2016 28th International Symposium on Power Semiconductor Devices and ICs (ISPSD), Prague, 2016, pp. 163-166; 0.

Rahimo, Munaf et al: "Charecterization of a Silicon IGBT and Silicon Carbide MOSFET Cross-Switch Hybrid"; IEEE Transactions on Power Electronics, Institute of Electrical and Electronics Engineers, USA; vol. 30, No. 9, Sep. 1, 2015 (Sep. 1, 2015), pp. 4638-4642, XP011578637.

Ye Wang, Nan Zhu, Cheng Yan and Dehong Xu, "Efficiency improvement of 2- and 3-level inverters for distributed photovoltaic application using hybrid devices," 2015 IEEE 2nd International Future Energy Electronics Conference (IFEEC), Taipei, 2015, pp. 1-7.

A. Deshpande and F. Luo, "Practical Design Considerations for a Si IGBT + SiC MOSFET Hybrid Switch: Parasitic Interconnect Influences, Cost, and Current Ratio Optimization," in IEEE Transactions on Power Electronics, vol. 34, No. 1, pp. 724-737, Jan. 2019, doi: 10.1109/TPEL.2018.2827989; 0.

F. Yuan et al., "Sizing Selection Optimization of SiC/Si Hybrid Switch in DC/DC Buck Converters," 2018 IEEE Energy Conversion Congress and Exposition (ECCE), Portland, OR, 2018, pp. 6160-6164.

R. A. Minamisawa, U. Vemulapati, A. Mihaila, C. Papadopoulos and M. Rahimo, "Current Sharing Behavior in Si IGBT and SiC MOSFET Cross-Switch Hybrid," in IEEE Electron Device Letters, vol. 37, No. 9, pp. 1178-1180, Sep. 2016.

H. Qin, D. Wang, Y. Zhang, D. Fu and C. Zhao, "The characteristic and switching strategies of SiC MOSFET assisted Si IGBT hybrid switch," IECON 2017—43rd Annual Conference of the IEEE Industrial Electronics Society, Beijing, 2017, pp. 1604-1609.

\* cited by examiner

CONTROL METHOD OF A HYBRID POWER SWITCH

CROSS-REFERENCE TO RELATED APPLICATIONS

This application claims priority to PCT Application No. PCT/EP2022/056524, having a filing date of Mar. 14, 2022, which claims priority to EP Application No. 21382238.0, having a filing date of Mar. 24, 2021, the entire contents both of which are hereby incorporated by reference.

FIELD OF TECHNOLOGY

The following relates to a control method of a hybrid power switch.

BACKGROUND

Semiconductor switching devices are the main elements regarding to efficiency and thermal design of a power converter. The type of the semiconductors is the most important parameter for the loss characteristics of the converter.

Power converters are commonly built using low frequency switching devices, such as silicon Si based switching devices e.g. SI IGBTs. The efficiency of power converters with Si based switching devices have a limit due to the conduction and switching loss characteristics. High frequency switching devices, such as silicon carbide (SiC) based switching devices, or others wide bandgap (WBG) switching devices, have a potential to be used in power converters because they provide superior performance characteristics relative to Si based switching devices. These SiC based switching devices have low switching losses at high switching rates e.g., at kilohertz (KHz) range and can operate at high temperatures compared with Si based switching devices. However, using SiC based switching devices significantly increase the cost.

To redress this cost and efficiency problem, hybrid power switches having a high frequency switching device connected in parallel with a low frequency switching device have been proposed as one of the solutions for power converters, for example a hybrid power switch having a SiC based switching device connected in parallel with a Si based switching device.

The control method of each hybrid power switch of a converter comprises providing gate signals to the switching devices of the hybrid power switch for turning on and turning off the switching devices. Said gate signals may be provided by a controller according to a predefined switching strategy of the converter. This means that predefined static gate signals are used for turning on and turning off the switching devices of the hybrid power switches according to a predefined operation mode of the converter.

Besides, in order to reduce switching losses of the low frequency switching devices of each hybrid power switch, the method also comprises a zero-voltage switching (ZVS) of the low frequency switching device. According to this, a first delay time $\Delta t\_on$ is established between the turning on t1_on of the high frequency switching device and the turning on t2_on of the low frequency switching device for turning on the high frequency switching device before the low frequency switching device. In addition, a second delay time $\Delta t\_off$ is established between the turning off t1_off of the high frequency switching device and the turning off t2_off of the low frequency switching device, for turning off the high frequency switching device after the low frequency switching device.

Notwithstanding that a power converter having hybrid switches that uses the above-mentioned control method allows a good performance at lower cost, there continues to be a need for more efficient methods of operating the hybrid power switches.

SUMMARY

An aspect relates to provide a control method of a hybrid power switch.

In a first aspect, a control method of a hybrid power switch having at least a first switching device connected in parallel with a second switching device is provided. The switching losses of the first device is lower than the switching losses of the second device for same current and voltage conditions. Firstly, a first gate signal is provided to the first switching device of the hybrid power switch for turning on and turning off the first switching device. A second gate signal is provided to the second switching device of the hybrid power switch for turning on and turning off the second switching device. In addition, a first delay time is stablished between the turning on of the first frequency switching device and the turning on of the second switching device, and a second delay time is established between the turning off of the first switching device and the turning off of the second switching device. Then, the temperature of the first switching device of the hybrid power switch is determined, and at least one of the first and second delay times is modified depending on the temperature of the first switching device. Such determined temperature is compared with a reference curve which defines a relationship between temperatures of the first switching device and percentage values $\Delta t/\Delta t_{max}$ [%] for modifying the delay time. A percentage value $\Delta t/\Delta t_{max}$ [%] according to the determined temperature is obtained using the reference curve and such percentage value is applied to the delay time so as to modify the delay time. The reference curve is established between three junction temperatures of the first switching device, and wherein below first junction temperature the reference curve is lineal and takes a constant value, from first junction temperature to second junction temperature the reference curve decreases linearly, and from second junction temperature to third junction temperature the reference curve further decreases linearly.

By using this method, no predefined static gate signals are used for turning on and turning off the high frequency switching devices of the hybrid power switches. Instead, the temperature of the first switching device of the hybrid power switch is taken into account for providing the gate signals, so in the event the first, e.g. a high frequency, switching device has a high temperature that can affect its performance, the time during said switching device is on may be modified to reduce its temperature.

These and other advantages and features of embodiments of the invention will become apparent in view of the figures and the detailed disclosure of embodiments of the invention.

BRIEF DESCRIPTION

Some of the embodiments will be described in detail, with reference to the following figures, wherein like designations denote like members, wherein:

FIG. 1 schematically show a hybrid power switch comprising a first switching device connected in parallel with a second switching device, according to an example;

Figure 8:
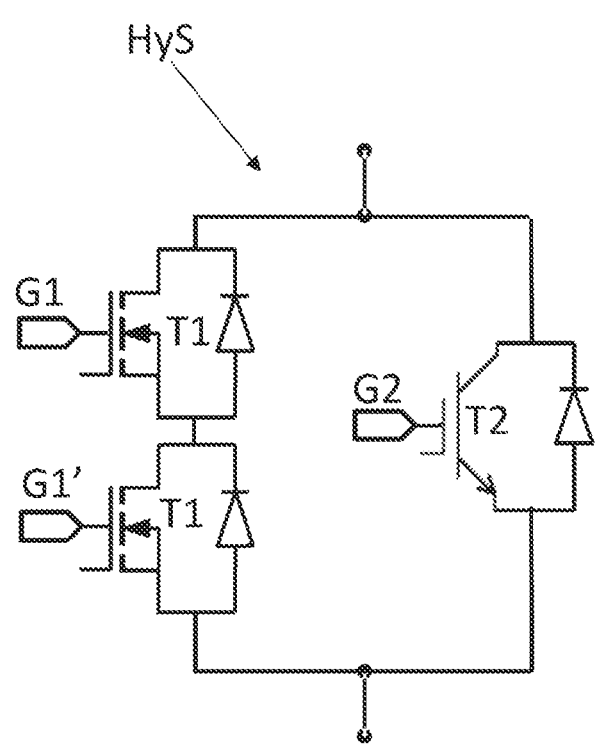
Figure 9A:
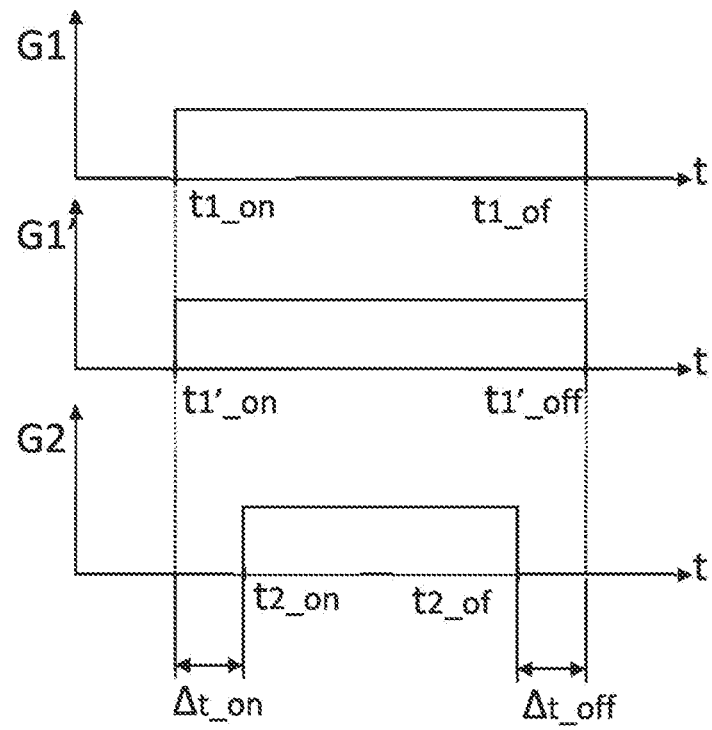
Figure 9B:
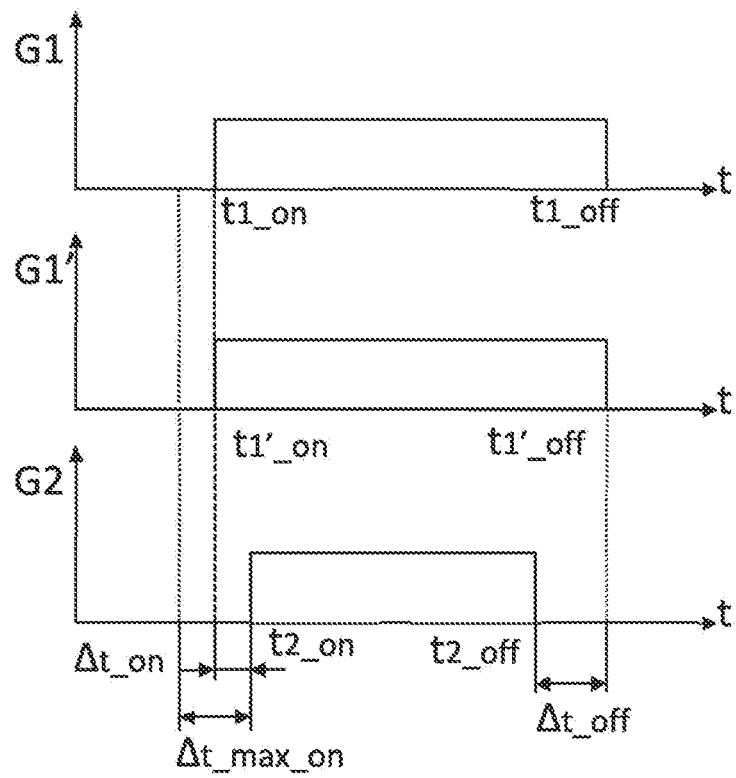
Figure 10:
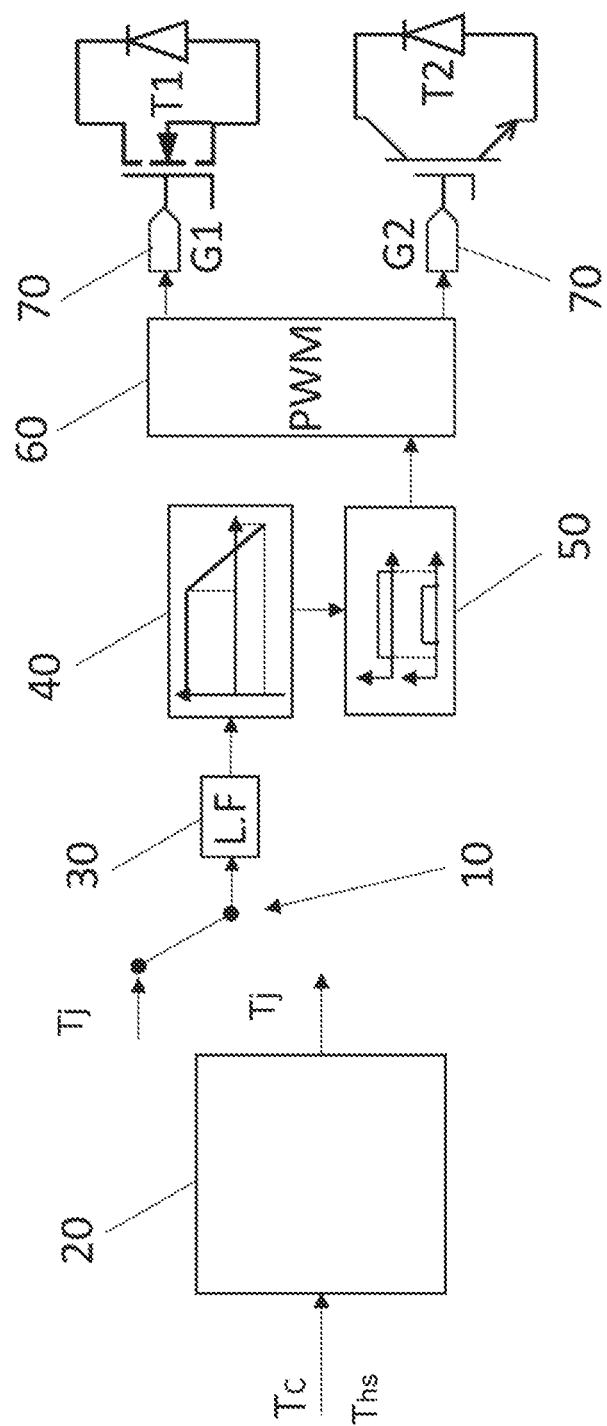
Figure 11:
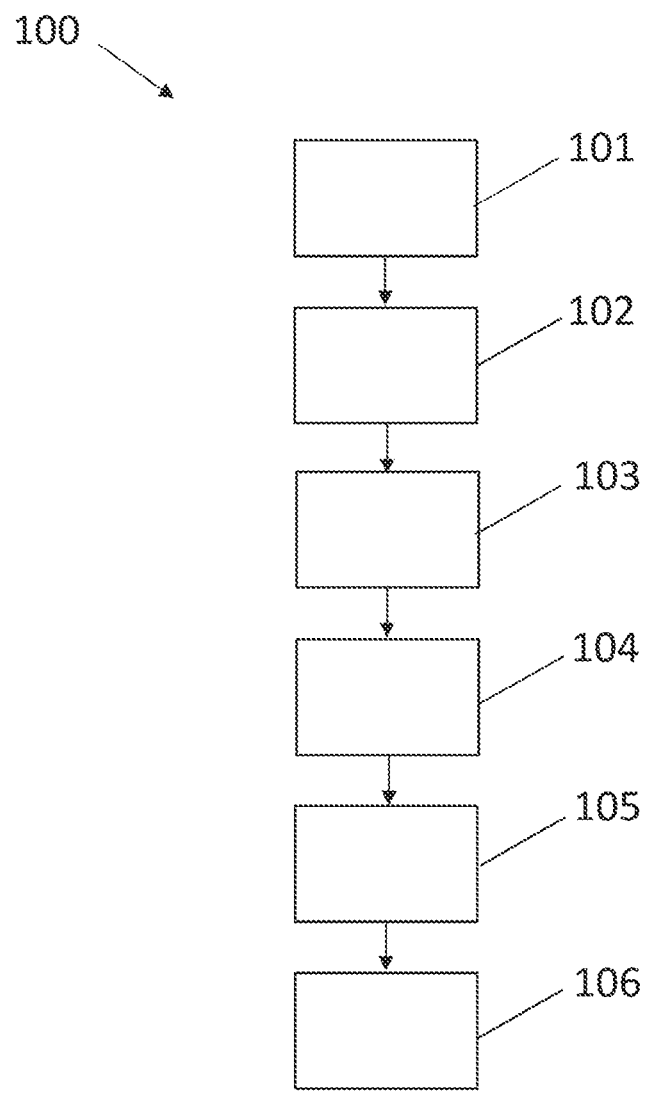

FIG. 8 schematically shows a hybrid power switch comprising more than one first switching devices connected in parallel with a second switching device, according to an example;

FIG. 9A shows a diagram of the gate signals for turning on/off the switching devices of the hybrid power switch of FIG. 8, according to an example;

FIG. 9B show an example of an operation mode of the hybrid power switch of FIG. 8;

FIG. 10 shows a diagram of a process for determining the delay times for each switching device of the hybrid power switch; and FIG. 11 shows a flow diagram of a control method of the hybrid power switch, according to an example.

DETAILED DESCRIPTION

Figure 1:
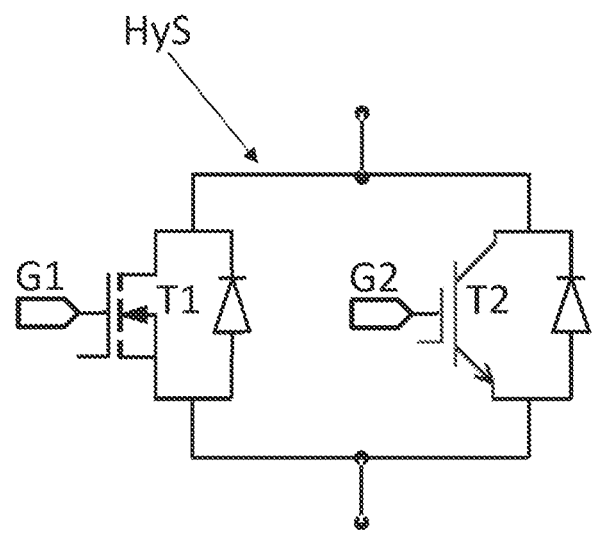

FIG. 1 schematically shows an example of a hybrid power switch HyS that may be used for building a power electronic device, e.g. a wind power converter. The hybrid power switch HyS may comprise a first switching device T1 and a second switching device T2. The first switching device T1 may be connected in parallel with the second switching device T2. As shown in FIG. 1, each switching device T1 and T2 may comprise a diode electrically connected in parallel in opposite forward direction.

The first switching device may be a high frequency switching device and the second switching device may be a low frequency switching device, that is, under same conditions, i.e. same current and voltage conditions, the first switching device may have lower switching losses than the second switching device.

The first switching device T1 may be a wide bandgap switching device e.g. a silicon carbide MOSFET, a silicon carbide FET, a Gallium nitride FET, or a diamond semiconductor. The second switching device T2 may be a silicon-based switching device e.g. a IGBT, a SI MOSFET, a IGCT, a thyristor or any other suitable device.

In the example of FIG. 1, first switching device T1 is a SiC MOSFET and second switching device T2 is a Si IGBT.

Figure 2:
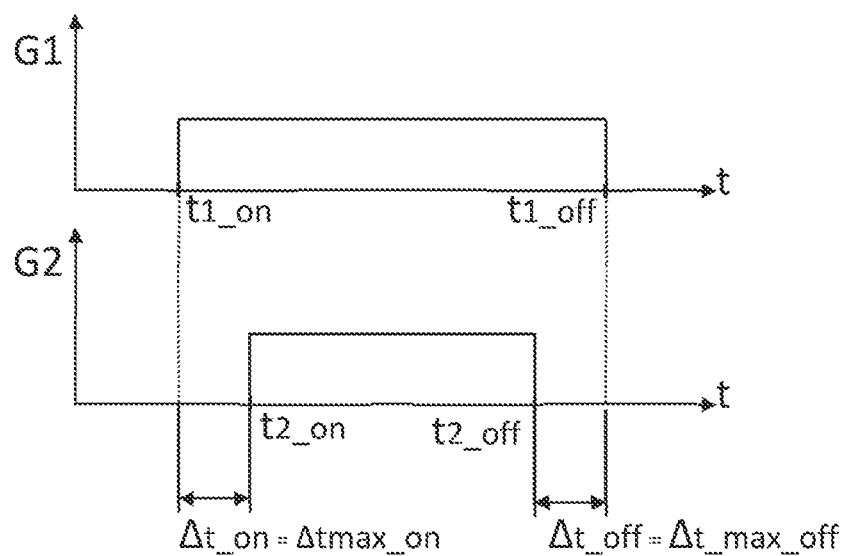
FIG. 2 shows a diagram of the gate signals for turning on/off the switching devices of the hybrid power switch of FIG. 1, according to an example.

As shown in FIG. 2, the control method of the hybrid power switch HyS may comprise providing a first gate signal G1 to the first switching device T1 of the hybrid power switch HyS for turning on and turning off the first switching device T1. The control method may also comprise providing a second gate signal G2 to the second switching device T2 of the hybrid power switch HyS for turning on and turning off the second switching device T2.

The gate signals G1 and G2 may be configured to selectively turn on/off respective switching devices. Said gate signals G1 and G2 may be provided by a controller of the hybrid power switch HyS and/or a controller 50 of the power converter according to a switching strategy. Said gate signals may be provided using a Pulse-Width Modulation (PWM) 60 of the converter (see FIG. 10).

The control method may also comprise establishing a first delay time $\Delta t\_on$ between the turning on t1_on of the first switching device T1 and the turning on t2_on of the second switching device T2. The control method may also comprise establishing a second delay time $\Delta t\_off$ between the turning off t1_off of the first switching device T1 and the turning off t2_off of the second switching device T2.

The first delay time $\Delta t\_on$ may be established for turning on the first switching device T1 before the second switching device T2. The second delay time $\Delta t\_off$ may be established for turning off the first switching device T1 after to the second switching device T2.

The first delay time $\Delta t\_on$ may be limited by a first maximum predefined delay time $\Delta t\_max\_on$ and the second delay time $\Delta t\_off$ may be limited by a second maximum predefined delay time $\Delta t\_max\_off$. The maximum predefined delay times $\Delta t\_max\_on$ and $\Delta t\_max\_off$ may be predetermined values provided by the controller for safety and adequate performance of the hybrid power switch HyS. Said maximum predefined delay times $\Delta t\_max\_on$ and $\Delta t\_max\_off$ may depend on the features of the switching devices, e.g. on the thermal load.

Said control method with delay times $\Delta t\_on$ and $\Delta t\_off$ allows a better performance of the hybrid power switch HyS. The first switching device T1, e.g. a SiC MOSFET, may have much lower switching losses than the second switching device T2, e.g. Si IGBT, due to the fast switching speed and the related material property. Therefore, the switching losses of the hybrid switch HyS may be dominated by the switching losses of the Si IGBT, i.e. the second switching device, which can be significantly reduced if most of the turning on and turning off actions are undertaken by the SiC MOSFET of the hybrid switch HyS, i.e. by the first switching device T1. By turning on earlier and turning off later the first switching device T1 e.g. a SiC MOSFET compared to the second switching device T2, e.g. a IGBT, almost zero voltage switching (ZVS) can be achieved in the IGBT at the turn-on and turn-off instants due to the very low on-state voltage across the IGBT. That is, the first switching device T1 may be turned on before (turning on) the second switching device T2, and may be turned off after (turning off) the second switching device T2.

However, the control method may require the first switching device T1 to be turned on more time than second switching device T2. Additionally, or alternatively, the first switching device T1 may take all or most of the current load during the turning on and turning off process. Thus, a raise in the temperature of the first switching device T1 may be expected. The time the first switching device T1 is turned on may depend on the temperature of said first switching device T1 of the hybrid power switch HyS. The current load at the first switching device may therefore be reduced.

For that purpose, the control method may further comprise determining the temperature of the first switching device T1 of the hybrid power switch HyS and modifying at least one of the first and second delay times $\Delta t\_on$ and $\Delta t\_off$ depending on the temperature of the first switching device T1.

At least one of the delay times $\Delta t\_on$, $\Delta t\_off$ may be reduced when temperature of the first switching device T1 is higher than a predetermined temperature Tj1. Said predetermined temperature Tj1 for safety performance may depend on the features of the first switching device T1.

The first gate signal G1 for turning on t1_on and turning off t1_off the first switching device T1 may be established from the second gate signal G2. In view of this, the first delay time Δt_on for turning on t1_on the first switching device T1 may be established from the turning on t2_on of the second switching device T2 and the second delay time Δt_off for turning off t1_off the first switching device T1 may be established from the turning off $t_{2off}$ of the second switching device T2. This means that the delay times Δt_on and Δt_off may be calculated from the turning on/off of the second switching device T2.

There may be different alternatives to reduce the period of time in which the first switching device T1 is turned on. FIGS. 3 to 6 show four examples of operation modes of the hybrid switch HyS for reducing the time the first switching device T1 is turned on.

Figure 3:
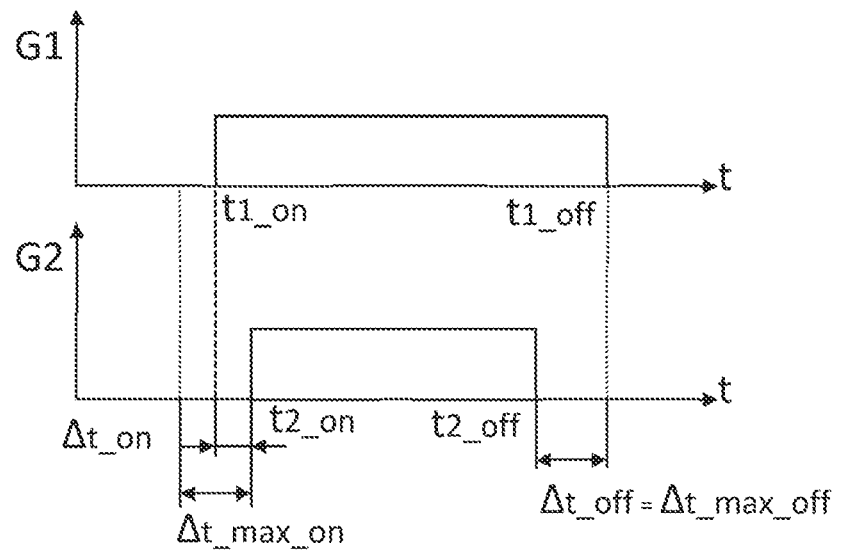
FIG. 3 shows an example of an operation mode of the hybrid power switch of FIG. 1.
Figure 4:
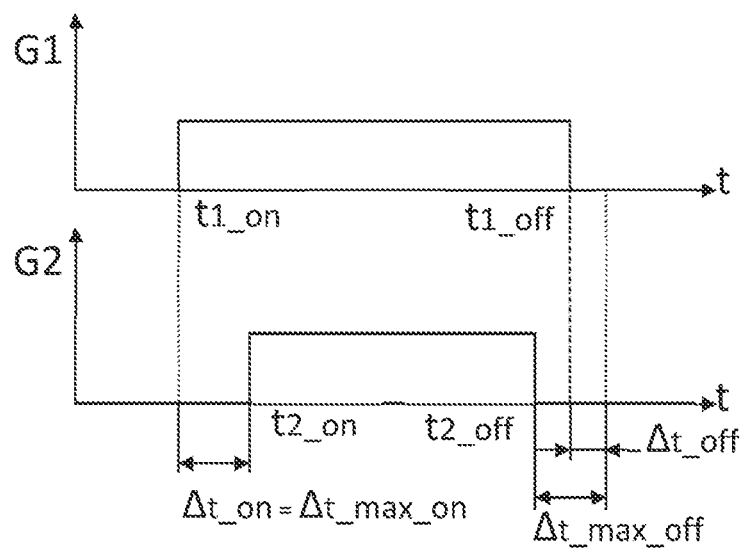
FIG. 4 shows an example of an operation mode of the hybrid power switch of FIG. 1.
Figure 5:
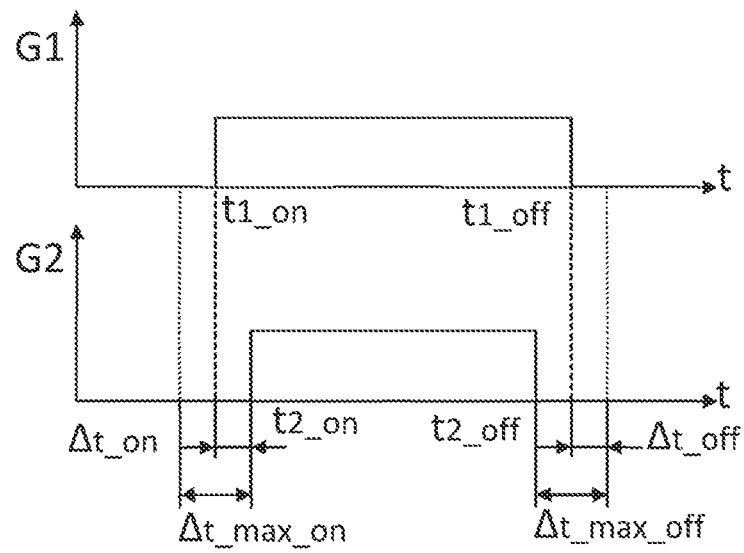
FIG. 5 shows an example of an operation mode of the hybrid power switch of FIG. 1.
Figure 6:
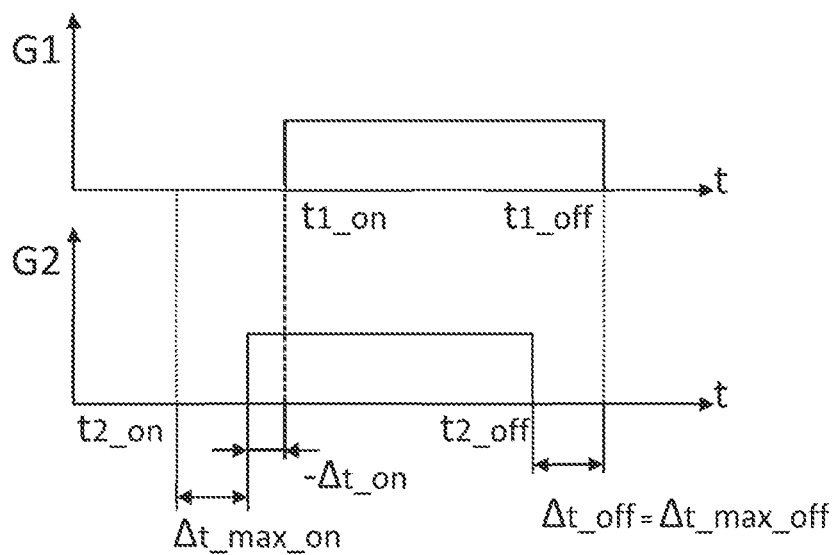
FIG. 6 shows examples of operation modes of the hybrid power switch of FIG. 1.

According to said FIGS. 3 to 6, the control method may comprise determining the temperature of the first switching device T1 of the hybrid power switch HyS and reducing at least one of the delay times Δt_on, Δt_off depending on the temperature of the first switching device T1. FIGS. 3 to 5 show examples where a delay time can be reduced from a positive value up to a zero value, while FIG. 6 shows an example where a delay time can be reduced from a positive value up to a negative value.

In the example of FIG. 3, the first delay time Δt_on may be reduced by delaying the turning on t1_on of the first switching device T1, while the second delay time Δt_off may not be modified. Thus, the period of time that the first switching device T1 is turned on may be reduced, e.g. if compared with the example of FIG. 2.

In the example of FIG. 4, the second delay time Δt_off may be reduced by advancing the turning off t1_off of the first switching device T1, while the first delay time Δt_on may not be modified. Thus, the period of time that the first switching device T1 is turned on may be reduced, e.g. if compared with the example of FIG. 2.

In the example of FIG. 5, the first delay time Δt_on may be reduced by delaying the turning on t1_on of the first switching device T1. The second delay time Δt_off may be reduced by advancing the turning off t1_off of the first switching device T1. Therefore, the period of time that the first switching device T1 is turned on may be further reduced and may be of shorter duration e.g. if compared with the examples of FIG. 3 or 4.

The first and second delay times Δt_on, Δt_off may be equal or different and may be selected according to the switching strategy established by the controller.

FIG. 6 shows a possible operation mode where the temperature of the first switching device T1 is greater than a determined temperature Tj2. In the example of FIG. 6, the turning on t1_on of the first switching device T1 may be delayed for reducing the first delay time Δt_on up to a negative delay time −Δt_on (|Δt_on|<0). A negative delay time −Δt_on may be established between the turning on t1_on of the first switching device T1 and the turning on t2_on of the second switching device T2, wherein the first switching device T1 may be turned on after the second switching device T2. In this operation mode of the hybrid switch HyS, the thermal load may be transferred to the second switching device T2. In any case, said negative delay time −Δt_on may be limited by the turning on process of the second switching device T2.

The maximum negative delay time −Δt_on may be limited by a predefined maximum turn on time in which the second switching device T2 can be maintained turned on. According to the example of FIG. 6, the negative delay time −Δt_on may be established according to the duration of the second switching device T2 turning on process. Initially the controller may provide, e.g. send, the second gate signal G2 for turning on t2_on the second switching device T2. Immediately after the switching device T2 has completed its turning on process, the controller may provide the first gate signal G1 for turning on t1_on the first switching device T1. Since the switching frequency of T1 is higher than the switching frequency of the second switching device T2, the first switching device T1 may be immediately turned on after the turning on process of the second switching device T2 ends, thus avoiding an overheat of the second switching device T2.

A negative delay time −Δt may also be applied only in the turning off of the first switching device T1, in same way as represented in the example of FIG. 4. The turning off t1_off of the first switching device T1 may be advanced for reducing the second delay time Δt_off up to a negative delay time −Δt_off. Therefore, a negative delay time −Δt_off may be established between the turning off t1_off of the first switching device T1 and the turning off t2_off of the second switching device T2, wherein the second switching device T2 may be turned off after turning off the first switching device T1. In said case the negative delay time −Δtoff may also be limited as explained above.

A negative delay time −Δt may also be applied in the turning on and in the turning off of the first switching device T1, in same way as represented in the example of FIG. 5. The turning on t1_on of the first switching device T1 may be delayed for reducing the first delay time Δt_on up to a first negative delay time −Δt_on. Therefore, a first negative delay time −Δt_on may be established between the turning on t1_on of the first device T1 and the turning on t2_on of the second switching device T2, wherein the first switching device T1 may be turned on after the second switching device T2. In addition, the turning off t1_off of the first switching device T1 may be advanced for reducing the second delay time Δt_off up to a second negative delay time −Δt_off. Therefore, a second negative delay time −Δt_off may be established between the turning off t1_off of the first switching device T1 and the turning off t2_off of the second switching device T2, wherein the second switching device T2 may be turned off after turning off the first switching device T1.

The modification of the first delay time Δt_on, or of the second delay time Δt_off may comprise:
  determining the temperature of the first switching device T1 of the hybrid power switch HyS,
  comparing said determined temperature with a reference curve c which defines a relationship between temperatures of the first switching device T1 and percentage values $$\frac{\Delta t}{\Delta t \max}[\%]$$

for modifying the delay time Δt_on, Δt_off,
  obtaining a percentage value $$\frac{\Delta t}{\Delta t \max}[\%]$$

according to the determined temperature using the reference curve c,
applying the percentage value to the delay time Δt_on, Δt_off so as to modify the delay time (Δt_on, Δt_off).

Figure 7:
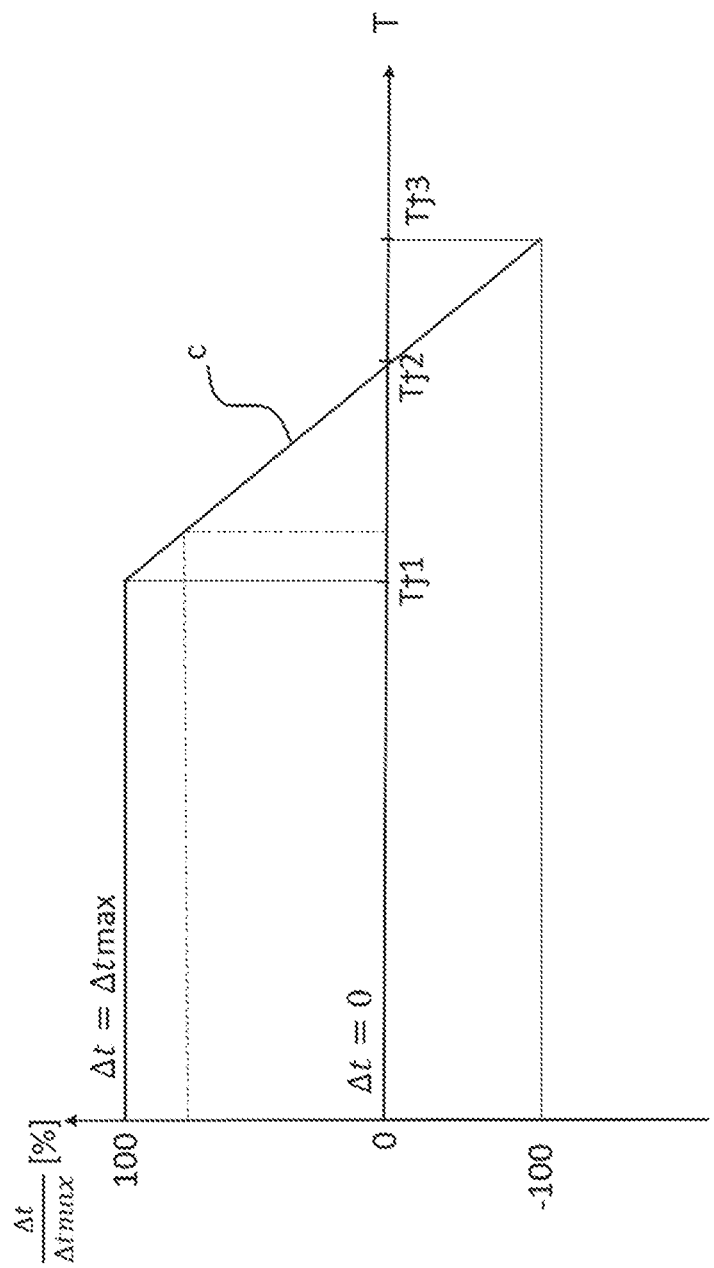
FIG. 7 shows a reference curve used for modifying the delay times for turning on/off the first switching device according to the temperature of the first switching device, according to an example.

FIG. 7 shows a graphic with the reference curve c that may be used for modifying the delay times Δt_on and Δt_off for turning on/off the first switching device T1 according to the temperature of switching device T1. The abscissa axis of the graphic represents the temperature values, and the ordinate axis represents the percentage values used for modifying the delay times Δt_on and Δt_off.

The reference curve c may be established between three junction temperatures: a first junction temperatures Tj1, a second junction temperatures Tj2, and a third junction temperatures Tj3 of the first switching device T1. Below the first junction temperature Tj1, the reference curve may be lineal and may have a constant value. From the first junction temperature Tj1 to the second junction temperature Tj2, the reference curve may decrease linearly. And from the second junction temperature Tj2 to the third junction temperature Tj3, the reference curve may further decrease linearly.

The reference curve c illustrated in FIG. 7 is a continuous curve, but in other examples it may be a discontinuous curve with sections established between three junction temperatures Tj1, Tj2, Tj3. The slope of the curve between the first and the second junction temperatures Tj1, Tj2 may be different to the slope between the second and the third junction temperatures Tj2, Tj3.

Below the first junction temperature Tj1, the reference curve may have a constant percentage value of 100%. At the second junction temperature Tj2, the reference curve may have a zero value, and at third junction temperature TJ3, the reference curve may have a negative percentage value.

Below the first junction temperature Tj1, the delay time Δt may be the maximum predefined delay time Δt_max. At the second junction temperature Tj2, the delay time Δt may be zero. At the third junction temperature Tj3, the reference curve may have a negative percentage value according to the maximum negative delay time –Δt as shown in the example of FIG. 6.

According to the proposed control method, the temperature of the second switching device T2 may be assumed to be below its threshold value, in any case, said temperature may be checked by a different controller of the converter in order to take the appropriate actions/decisions if the threshold value is overpassed.

In examples wherein both delay times Δt_on and Δt_off are modified, the percentage value for modifying the first delay time Δt_on may be multiplied by a turning-on weight factor W_on. and the percentage value for modifying the second delay time Δt_off may be multiplied by a turning-off weight factor W_off. Such weight factors W_on, and W_off may have a predefined value between 0 and 1. According to this, the delay times applied between the turning on and turning off of the switches of the power hybrid switch HyS may have different duration. If no differentiation is required, turning-on/off weight factors W_on, W_off may be 0. In an example, the weight factors W_on, W_off may be applied according to the current sharing ratio inside the power hybrid switch HyS.

In an example, the hybrid switch HyS may comprise a SiC MOSFET, i.e. first switching device T1, having a first junction temperature Tj1 of 132° C., a second junction temperature Tj2 of 170° C., and third junction temperature Tj3 of 175° C. Thus, in the event the determined temperature of the SiC MOSFET is 140° C., and by using the reference curve c of FIG. 7, a percentage value of approximately 80% is obtained (see the dashed line of FIG. 7). Said percentage value may be applied to the first delay time Δt_on, to the second delay time Δt_off, or to both delay times Δt_on, Δt_off.

If said percentage value is applied to both delay times Δt_on, Δt_off, the weight factors W_on, W_off may also be applied. For example, the turning-on weight factor W_on and the turning-off weight factor W_off may be 0.75 and 1 respectively. Therefore, the percentage value to be applied to the first delay time Δt_on may be 0.75×80%=60%, and the percentage value to be applied to the second delay time Δt_off may be 1×80%=80%.

The temperature of the first switching device T1 may be measured e.g. by a sensor, or may be estimated. The temperature may be measured directly from the first switching device T1, for that purpose, the hybrid power switch HyS may comprise outputs giving temperature data of the switching devices T1 and T2. Alternatively, the temperature may be indirectly measured from the case, i.e. the case temperature Tc; or the heatsink, i.e. heatsink temperature Ths; of the switching devices T1, to that end, the indirectly measured temperature may be converted into the real junction temperature of the switching device T1. Alternatively, the temperature may be estimated. Said estimation may be made by using optical and physical methods e.g. IR camera, thermocouples, temperature sensors, etc., or electrical methods e.g. additional sensing elements, using electrical parameters, RC thermal network, etc. In these examples, a conversion into the real junction temperature may also be required.

As shown in FIG. 8, the hybrid power switch HyS may comprise more than one first switching devices T1 connected in series therebetween and connected in parallel with a second switching device T2. In such examples, the hybrid power switch HyS may comprise two or more first switching devices T1 of the same type, e.g. SiC MOSFETs, SiC FETs, GaN FETs, diamond semiconductors, etc.; connected in parallel with a second switching device T2, e.g. a SI IGBT, a SI MOSFET, an IGCT, a thyristor or any other suitable device. Each type of first switching device T1 may have one reference curve. Each first switching device T1 may have a gate signals G1, G1' for turning on and turning off first switching devices; and the second switching device T2 may have a gate signal G2 for turning on and turning off the second switching device.

According to example of FIG. 8, the hybrid power switch HyS may comprise two SiC MOSFETs connected in parallel with a Si IGBT. As stated above, the two SiC MOSFETs may have the same reference curve and so the delay times for both SiC MOSFETs may be the same.

FIG. 9A shows a diagram of the gate signals G1, G1' and G2 for turning on/off two first switching devices T1 and a second switching device T2. As shown in the figure, the gate signals G1, G1' may be identical for both first switching devices.

FIG. 9B shows the control method of FIG. 3 having a further first switching device added, i.e. for a hybrid power switch HyS comprising two first switching devices T1 connected in parallel with a second switching device T2, e.g., as shown in FIG. 8.

FIG. 10 shows a diagram with a process for determining the delay times of each switching device of the hybrid power switch.

Initially, a selector 10 may be used in order to choose the temperature data source of the first switching device T1. As stated above, it may be a junction temperature Tj directly measured from the junction or it may be the case temperature Tc or the heatsink temperature Ths. Alternatively, the temperature of the first switching device T1 may be an estimated temperature.

If the temperature is obtained from the case or the heatsink, an RC network or look-up table 20 may be used to convert the case temperature Tc or the heatsink temperature Ths into a junction temperature Tj. After the selector 10, a low pass filter 30 may be used to eliminate or substantially dampen the sudden changes or unwanted noises in the temperature measurements or estimations.

Another look-up table 40 with the reference curve c may be used to determine the delay times Δt_on and Δt_off. The converter control system 50 may determine the gate signals G1 and G2 of the first and second switches T1, T2 according to the delay times Δt_on and Δt_off. Then, the gate signals G1 and G2 may be applied to the switching devices T1 and T2 through the gate drives 70 e.g. using a pulse width modulator (PWM) 60.

A power converter may comprise several hybrid power switches HyS, each hybrid power switches having several types of switches inside. For example, a converter may comprise a first type of hybrid power switches HyS1 with a plurality of SiC MOSFETs in series therebetween connected in parallel with an IGBT, and a second type of hybrid power switches HyS2 with a plurality of GaN FETs in series therebetween connected in parallel with an IGBT. In such examples, the look-up table 40 may have several reference curves, i.e. one curve for each type of first switching device T1.

FIG. 11 shows a flow diagram of a control method 100 of the hybrid power switch HyS having at least a first switching device T1 connected in parallel with a second switching device T2. Firstly, a first gate signal G1 may, in block 101, be provided to the first switching device T1 of the hybrid power switch HyS for turning on and turning off the first switching device T1. A second gate signal G2 may, in block 102, be provided to the second switching device T2 of the hybrid power switch HyS for turning on and turning off the second switching device T2. Then, a first delay time Δt_on may, in block 103, be established between the turning on t1_on of the first switching device T1 and the turning on t2_on of the second switching device T2. A second delay time Δt_off may, in block 104, be established between the turning off t1_off of the first switching device T1 and the turning off t2_off of the second switching device T2. In addition, the temperature of the first switching device T1 of the hybrid power switch HyS may, in block 105, be determined, and a at least one of the first and second delay times Δt_on, Δt_off may, in block 106, be modified depending on the temperature of the first switching device T1.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements.

The invention claimed is:

1. A control method of a hybrid power switch having at least a first switching device connected in parallel with a second switching device, wherein switching losses of the first switching device are lower than switching losses of the second switching device for same current and voltage conditions, the method comprising:

providing a first gate signal to the first switching device of the hybrid power switch for turning on and turning off the first switching device;

providing a second gate signal to the second switching device of the hybrid power switch for turning on and turning off the second switching device, establishing a first delay time between the turning on of the first switching device and the turning on of the second switching device;

establishing a second delay time between the turning off of the first switching device and the turning off of the second switching device;

determining a temperature of the first switching device of the hybrid power switch;

modifying at least one of the first delay time and the second delay time depending on the temperature of the first switching device;

comparing the temperature with a reference curve which defines a relationship between temperatures of the first switching device and percentage values for modifying the at least one of first delay time and the second delay time;

obtaining a percentage value according to the temperature using the reference curve; and applying the percentage value to the at least one of first delay time and the second delay time so as to modify the at least one of first delay time and the second delay time, wherein the reference curve is established between three junction temperatures of the first switching device, and wherein below a first junction temperature the reference curve is lineal and takes a constant value, from the first junction temperature to a second junction temperature the reference curve decreases linearly, and from the second junction temperature to a third junction temperature the reference curve further decreases linearly.

2. The method according to claim 1, wherein the modifying at least one of the first delay time and the second delay time comprises:

delaying the turning on of the first switching device thereby reducing the first delay time.

3. The method according to claim 1, wherein the modifying the at least one of the first delay time and the second delay time comprises:

advancing the turning off of the first switching device thereby reducing the second delay time.

4. The method according to claim 1, wherein the modifying the at least one of the first delay time and the second delay time comprises:

delaying the turning on of the first switching device thereby reducing the first delay time; and advancing the turning off of the first switching device thereby reducing the second delay time.

5. The method according to claim 1, wherein below the first junction temperature the reference curve has a constant percentage value of 100%, at the second junction temperature the reference curve has a percentage value of zero, and at the third junction temperature the reference curve has a negative percentage value.

6. The method according to claim 1, further comprising:

multiplying the percentage value for modifying the first delay time with a turning-on weight factor, and multiplying the percentage value for modifying the second delay time with a turning-off weight factor, wherein turning-on and turning-off weight factors have a predefined value between 0 and 1.

7. The method according to claim 1, wherein the first switching device is turned on before the second switching device.

8. The method according to claim 1, wherein the first switching device is turned on after the second switching device.

9. The method according to claim 1, wherein the first switching device is turned off after the second switching device.

10. The method according to claim 1, wherein the first switching device is wide band gap switch.

* * * * *